United States Patent
Velappan et al.

(10) Patent No.: US 9,899,560 B2
(45) Date of Patent: Feb. 20, 2018

(54) METHOD OF MANUFACTURING THIN-FILM SOLAR CELLS WITH A P-TYPE CDTE LAYER

(71) Applicants: China Triumph International Engineering Co., Ltd., Shanghai (CN); CTF Solar GmbH, Dresden (CN)

(72) Inventors: Krishnakumar Velappan, Dresden (DE); Shou Peng, Shanghai (CN)

(73) Assignees: China Triumph International Engineering Co., Ltd., Shanghai (CN); CTF Solar GmbH, Dresden (DE)

( * ) Notice: Subject to any disclaimer, the term of this patent is extended or adjusted under 35 U.S.C. 154(b) by 71 days.

(21) Appl. No.: 14/687,938

(22) Filed: Apr. 16, 2015

(65) Prior Publication Data

US 2016/0308086 A1      Oct. 20, 2016

(51) Int. Cl.
| | |
|---|---|
| *H01L 21/00* | (2006.01) |
| *H01L 31/18* | (2006.01) |
| *H01L 31/0445* | (2014.01) |
| *H01L 31/0296* | (2006.01) |
| *H01L 31/073* | (2012.01) |
| *H01L 21/02* | (2006.01) |

(52) U.S. Cl.
CPC ...... *H01L 31/1828* (2013.01); *H01L 21/0248* (2013.01); *H01L 21/0257* (2013.01); *H01L 21/02562* (2013.01); *H01L 21/02581* (2013.01); *H01L 21/02664* (2013.01); *H01L 31/02963* (2013.01); *H01L 31/0445* (2014.12); *H01L 31/073* (2013.01); *H01L 31/186* (2013.01); *H01L 31/1884* (2013.01); *Y02E 10/543* (2013.01)

(58) Field of Classification Search
CPC ..................................................... H01L 31/075
USPC ............................................................ 438/87
See application file for complete search history.

(56) References Cited

U.S. PATENT DOCUMENTS

| | | | | |
|---|---|---|---|---|
| 4,445,965 | A | * 5/1984 | Milnes | .................... C30B 23/02 117/101 |
| 2009/0242029 | A1 | * 10/2009 | Paulson | .............. C23C 14/0629 136/260 |
| 2011/0162696 | A1 | * 7/2011 | Vlcek | ............... H01L 31/02242 136/255 |

(Continued)

FOREIGN PATENT DOCUMENTS

| | | |
|---|---|---|
| CN | 102939668 A | 2/2013 |
| DE | 102014202961.9 | 8/2015 |

*Primary Examiner* — Moazzam Hossain
*Assistant Examiner* — Hajar Kolahdouzan
(74) *Attorney, Agent, or Firm* — Michael Soderman

(57) ABSTRACT

The present invention proposes a method to produce thin film CdTe solar cells having a pin-hole free and uniformly doped CdTe layer with a reduced layer thickness. The method according to the present invention is an efficient way to prevent shunting of the solar cells, to improve reliability and long-term stability of the solar cells and to provide a uniform doping of the CdTe layer. This is achieved by applying a sacrificial doping layer between a first CdTe layer having large grains and a second CdTe layer having small grains, which together form the CdTe layer of the solar cells. Furthermore it provides the possibility to eliminate the $CdCl_2$ activation treatment step in case the sacrificial doping layer comprises a halogen.

16 Claims, 1 Drawing Sheet

(56) References Cited

U.S. PATENT DOCUMENTS

2013/0180579 A1\* 7/2013 Jin ........................ H01L 31/073
                                                       136/255
2013/0280854 A1\* 10/2013 Jasieniak ............... B82Y 30/00
                                                        438/93

\* cited by examiner

State of the Art

METHOD OF MANUFACTURING THIN-FILM SOLAR CELLS WITH A P-TYPE CDTE LAYER

BACKGROUND

The objective of the present invention is a method of producing CdTe solar cells with increased efficiency.

The distribution of thin-film solar cells may be accelerated further by increasing their electric efficiency in light conversion. Solar cells based on CdTe have proven particularly promising in this respect.

In the state of the art, the CdTe solar cell has the following structure: on a glass substrate, a transparent conducting oxide layer (TCO) is deposited as front contact. The TCO layer can include a high resistive buffer layer which helps to minimise the shunting effect in solar cell. On this, a layer of cadmium sulfide (CdS) and on top of that, a layer of cadmium telluride (CdTe) are deposited. Finally a metal layer is applied to collect the charge carriers. This process is called superstrate configuration.

In producing the solar cells the substrate (preferably glass) forms the base on which the subsequent layers are deposited one after another.

In CdTe solar module preparation normally the thickness of the CdTe layer is maintained in the range of 4 to 5 µm. However, theoretical simulations of the CdTe solar cells show that solar cells with 1 µm CdTe layer could also yield reasonable high efficiency. In principle reducing the CdTe film thickness from 4 to 2 µm could help to reduce CdTe material consumption by 30-40% in module production. The CdTe film thickness reduction would also help to reduce layer deposition time and thereby expedite module production.

High efficiency solar cells are normally achieved with CdTe deposition at substrate temperatures>500° C. The CdTe layer at this temperature has large grains which could result in formation of pinholes. Therefore, simply reducing the layer thickness has several negative influences over the solar cell efficiency and longtime stability. While reducing the film thickness (<3 µm), pinholes are formed in the CdTe layer leading to shunting of the solar cells. This problem will be more pronounced if there is an etching process involved in solar cell production which will lead to poor performance of the solar cell. Furthermore, the reduction in shunt resistance value leads to a low fill factor and eventually reduced efficiency. Therefore, minimizing the pinhole formation in CdTe layer is necessary in order to obtain high efficiency solar cells.

In addition to this, increasing the p-doping of the CdTe layer is also important to achieve high efficiency solar cells. Further increase in efficiency of the CdTe solar cells may be achieved by doping the CdTe layer. According to the theoretical predictions, heavy p-doping of CdTe is limited due to the formation of the self-compensation effect. Only a certain level of p-doping can be achieved by using an appropriate doping element and a process providing a doping element to the CdTe layer after depositing the CdTe layer. During the preparation of the CdTe solar cell, the extrinsic p-doping of CdTe layer is normally done after the activation process and involves post annealing treatment to induce diffusion of doping elements. The well-known and easy p-dopant for CdTe layer is Cu.

The object of the present invention is to obtain a solar cell comprising a doped CdTe layer with a reduced thickness and without pinholes. Furthermore, it is the object of the present invention to simplify the production process of CdTe solar cells.

SUMMARY

The present invention proposes a method to produce thin film CdTe solar cells having a pin-hole free and uniformly doped CdTe layer with a reduced layer thickness. The method according to the present invention is an efficient way to prevent shunting of the solar cells, to improve reliability and long-term stability of the solar cells and to provide a uniform doping of the CdTe layer. This is achieved by applying a sacrificial doping layer between a first CdTe layer having large grains and a second CdTe layer having small grains, which together form the CdTe layer of the solar cells. Furthermore it provides the possibility to eliminate the $CdCl_2$ activation treatment step in case the sacrificial doping layer comprises a halogen.

DETAILED DESCRIPTION

According to the invention, the process of producing a CdTe solar cell comprises a step of forming a first CdTe layer having large grains on a base layer, a step of forming a sacrificial doping layer comprising a doping element on the first CdTe layer and a step of forming a second CdTe layer having small grains on the sacrificial doping layer.

The preferred material of the sacrificial doping layer is selected out of a group of materials comprising copper, phosphorus, antimony, bismuth, molybdenum or manganese as the doping element. According to one embodiment, the doping element is provided as an elemental layer. In another embodiment, the doping element is provided in a combination of different elements, for instance copper and antimony or antimony and bismuth, or in a composition, wherein the composition is preferably a compound of any of the mentioned doping elements with a halogen, for instance $SbCl_3$. The preferred halogen for the composition of the sacrificial doping layer is fluorine (F), most preferred chlorine (Cl). The preferably used compounds are chlorides.

The sacrificial doping layer can be applied using methods according to state of the art. Preferably used are physical or dry chemical processes or wet chemical processes such as, but not limited to:

Sputtering,
Electro-deposition,
Spraying solution of compound comprising halogen, wherein the compound is dissolved in water or in another known solvent,
Spin coating,
Dipping the substrate (or the surface of the first CdTe layer) into a solution which contains the doping element or a compound of it,
Sponge roller coating, etc.

Compounds comprising a halogen are preferably applied by wet processing, more preferably by sponge roller coating.

The thickness of the sacrificial doping layer depends on the dimensions of the CdTe layer resulting from fusion of the first CdTe layer and the second CdTe layer and on the used doping element. Regarding the thickness of the CdTe layer, the thickness of the sacrificial doping layer is chosen such that a predetermined doping level of the CdTe layer is achieved when the sacrificial doping layer is completely dissolved. In case of elemental antimony as the sacrificial doping layer, the thickness of the sacrificial doping layer is preferably approximately one thousandth of the thickness of the CdTe layer. Some examples are given in Table 1, where also the respective approximate thicknesses of the first and the second CdTe layer are given.

TABLE 1

| 1$^{st}$ CdTe layer thickness (nm) | 2$^{nd}$ CdTe layer thickness (nm) | CdTe layer total thickness (nm) | Doping layer thickness in case of Sb (nm) |
|---|---|---|---|
| 4000 | 1000 | 5000 | 5 |
| 2400 | 600 | 3000 | 3 |
| 1600 | 400 | 2000 | 1-2 |
| 500 | 500 | 1000 | 0.5-1 |

However, also other doping elements or compositions comprising the doping element may be used. Generally, the thickness of the sacrificial doping layer is preferably in a range of 2 nm to 15 nm. If copper is used as the doping element, the thickness of the sacrificial doping layer should be reduced with respect to that when using other doping elements, since a high degree of copper would lead to degradation of the solar cell over time. Preferably, the thickness of a sacrificial doping layer comprising copper as the doping element should be 30% smaller than the thickness of a sacrificial doping layer comprising another doping element, for instance antimony.

The sacrificial doping layer is preferably applied on the first CdTe layer at a substrate temperature in the range from room temperature to 350° C. The substrate temperature should not exceed 350° C., since higher substrate temperatures would make it difficult to apply the sacrificial doping layer with the mentioned small thickness due to re-evaporation issues. If compounds comprising a halogen are used for applying the sacrificial doping layer, the substrate temperature is preferably in the range of room temperature to 100° C.

The first CdTe layer is applied on a base layer as a layer having large grains. The grains of the first CdTe layer have sizes in the order of micrometers, for instance in the range of 2 μm to 5 μm. This is achieved by depositing the first CdTe layer at a substrate temperature in the range of 490° C. to 540° C., wherein the thickness of the first CdTe layer lies between 0.5 μm and 6 μm, more preferably between 1 μm and 1.8 μm. The base layer is a layer stack comprising a transparent substrate, a transparent front contact layer and a CdS layer in case the solar cell is produced in a superstrate configuration. The base layer is a layer stack comprising a substrate and a back contact layer in case the solar cell is produced in a substrate configuration. Further details of these configurations are described later.

The thickness of the second CdTe layer lies preferably between 1% and 100% of the total thickness of the first CdTe layer depending on the total CdTe layer thickness requirement. More preferably, the thickness of the second CdTe layer lies between 20% and 30% of the total CdTe layer thickness. The total CdTe layer thickness can be in the range of 0.5 μm to 8 μm. Only for very thin total CdTe layers with a layer thickness of 0.5 μm to 1.5 μm, the thickness of the second CdTe layer can be around 40-50% of the total CdTe layer thickness in order to fill the pin-holes and/or grain boundaries of the first CdTe layer. The thickness percentage of the second layer thickness is given only as an example. According to the invention, the method can work with second layer thickness in any of the thickness range.

The second CdTe layer is applied as a layer having small grains and serves to fill or cover the pin-holes and/or grain boundaries of the first CdTe layer. The grains of the second CdTe layer have sizes in the order of nanometers, for instance in the range of 100 nm to 500 nm. Thus the formation of shunting between the back contact and the front contact of the solar cell as well as the migration of impurities along the grain boundaries within the CdTe layer can be reduced or avoided. The deposition of a small-grain layer is achieved by depositing the second CdTe layer at a substrate temperature in the range from 200° C. to 350° C.

The first and the second CdTe layer can be deposited by any known method including but not limited to close space (d) sublimation (CSS), chemical bath deposition (CBD), sputtering, electro-deposition or any other physical or chemical methods.

According to one embodiment of the method for producing a solar cell, the method further comprises a temperature treatment step performed after depositing the second CdTe layer. That is, the temperature treatment step may be performed directly following the step of applying the second CdTe layer or may be performed at a later process step, for instance after applying a cover layer, which might be a sacrificial cover layer.

The temperature treatment step includes heating the substrate to a temperature in the range of 300° C. to 550° C. Most preferably, the substrate temperature during the temperature treatment process should not exceed 450° C. if the second CdTe layer lies open, i.e. is not covered by another layer, in order to prevent re-evaporation of the CdTe.

Preferably, a material containing a halogen is provided on the surface of the second CdTe layer during the temperature treatment step. This process step corresponds to the so called activation step known from the state of the art in the production of CdTe solar cells. Usually, $CdCl_2$ is used as the material containing a halogen for this temperature treatment step, wherein the $CdCl_2$ is applied onto the CdTe layer by wet chemical method or by vacuum evaporation followed by annealing in air atmosphere at defined temperature (normally in the range of 380° C.-440° C.). The benefits of this activation step include reduction of lattice mismatch between the CdS/CdTe layers and CdTe layer grain boundary passivation. The $CdCl_2$ activation induced inter-diffusion between the CdS and CdTe layer helps to achieve smooth electronic band transition at the CdS/CdTe junction. However, a disadvantage of this approach is that the $CdCl_2$ is a potentially hazardous material and therefore difficult to manage in production line.

If the sacrificial doping layer comprises a halogen, the use of $CdCl_2$ may be avoided, since the halogen component comprised in the sacrificial doping layer helps in passivating the grain boundaries in the CdTe layer. Therefore, the temperature treatment step of the present invention is preferably performed without providing a halogen containing material on the surface of the second CdTe layer, since the inventive method mimics the $CdCl_2$ activation process under these conditions.

The thermal energy available during the temperature treatment step induces decomposition of the sacrificial doping layer into its components and/or diffusion of its components, in particular of the doping element, into and/or through the CdTe layer. Thus, the sacrificial doping layer is broken down, which characterises the doping layer as a sacrificial layer. In the result, the first CdTe layer and the second CdTe layer are now bordering on each other and form the CdTe layer of the solar cell.

However, the production process of solar cells may comprise different process steps involving higher temperatures, for instance the deposition of CdTe layers. Therefore, dissolving of the sacrificial doping layer and diffusion of its components may also occur, at least partially, during the deposition of the sacrificial doping layer, the deposition of the second CdTe layer and/or other process steps performed after applying the second CdTe layer, for instance a process step for applying a contact layer. Therefore, the above mentioned temperature treatment step may be preserved, if a halogen containing sacrificial doping layer is used and if the process steps following the step of applying the sacrificial doping layer provide a thermal budget sufficient for dissolving the sacrificial doping layer and diffusing the doping element.

Since the diffusion of doping elements takes place from "inside" the CdTe layer, the CdTe layer is doped more uniform than it is in case of providing a doping layer on top of the deposited complete CdTe layer as it is state of the art. At least, a nearly uniform doping of the CdTe layer is achieved applying a lower thermal budget to the solar cell during the production process as compared to processes according to the state of the art. "Nearly uniform doping" means that no or only a small concentration gradient of the doping element can be measured within the CdTe layer.

In another embodiment of the invention, depending on the doping layer material selection, the excess doping element, i.e. doping element atoms which cannot be incorporated into the CdTe crystals, can accumulate on the surface of the second CdTe layer. This happens due to the grain boundary assisted preferential impurity diffusion, especially due to the second CdTe layer with smaller grains. The excess doping elements can be washed or rinsed away by using suitable solvents or a following process of nitric-phosphoric acid etching can remove it.

The inventive method for producing a solar cell may be used for producing solar cells in a superstrate configuration or in a substrate configuration.

The method for producing a solar cell in superstrate configuration further comprises providing a transparent substrate, preferably of glass, applying a transparent front contact layer or layer stack, for instance of TCO, and applying a CdS layer on the transparent front contact layer or layer stack. After applying the CdS layer, the above described inventive method is performed, wherein the layer stack comprising the transparent substrate, the transparent front contact layer and the CdS layer serves as the base layer for applying the first CdTe layer. That is, the first CdTe layer, the sacrificial doping layer and the second CdTe layer are applied in this order onto the CdS layer. Further, the described temperature treatment process, for instance a $CdCl_2$ activation process and nitric-phosphoric acid etching process, may be performed, before applying a back contact layer or layer stack.

The CdTe surface is washed using suitable solution such as water or methanol. The back contact layer may comprise a metal, any other suitable conductive material or a suitable semiconducting layer (such as $Sb_3Te_2$) according to the state of art.

In the production process of substrate configuration solar cells, the steps in addition to the steps of applying the first CdTe layer having large grains, applying the sacrificial doping layer and applying the second CdTe layer having small grains are performed basically in a reverse order. The substrate can be a flexible metal foil such as molybdenum which can serve as back contact to collect the photo induced electrical charges or can be any other suitable substrate according to the state of art. Thus, first a substrate is provided on which the back contact layer or layer stack is applied, followed by applying the first CdTe layer, the sacrificial doping layer and the second CdTe layer. That is, the layer stack comprising the substrate and the back contact layer serves as the base layer for applying the first CdTe layer. Subsequently, the CdS layer and the transparent front contact layer, for instance TCO, are applied, wherein a temperature treatment process as described above may be performed after applying the second CdTe layer or even after applying the CdS layer and/or the transparent front contact layer. Optionally, depending on the CdS and TCO deposition methods, the diffusion of the doping element can also happen already during CdS and/or TCO deposition process. In case a $CdCl_2$ activation process is involved, the doping element can also diffuse during the activation process. In such conditions, an additional post annealing treatment to diffuse the doping element may not be necessary.

The process steps of applying a (transparent) substrate, applying a front contact layer, applying a CdS layer and applying a back contact layer are performed according to well-known methods from prior art and are therefore not described in detail herein. It should be noted that, in the production process of substrate configuration solar cells, the step of applying a CdS layer should be performed at relatively low substrate temperatures in the range of 200° C. to 350° C. in order to prevent re-evaporation of the CdTe layer. This can be achieved by using a well-known sputtering process for depositing the CdS layer.

DETAILED DESCRIPTION OF THE PREFERRED EMBODIMENTS

The method according to the invention is explained in the following in a first exemplary embodiment showing the making of a solar cell in superstrate configuration, without intending to imply a restriction to said embodiment.

Figure 1:
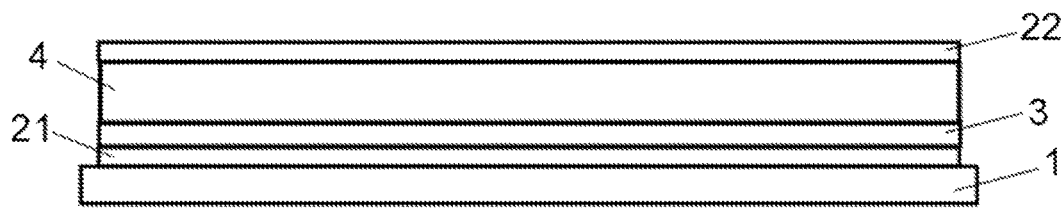
FIG. 1 schematically shows the layer structure of a solar cell according to the state of the art. Said solar cell comprises on the substrate (1) a layer sequence consisting of front contact (21), CdS layer (3), CdTe layer (4) and back contact (22).
Figure 2A:
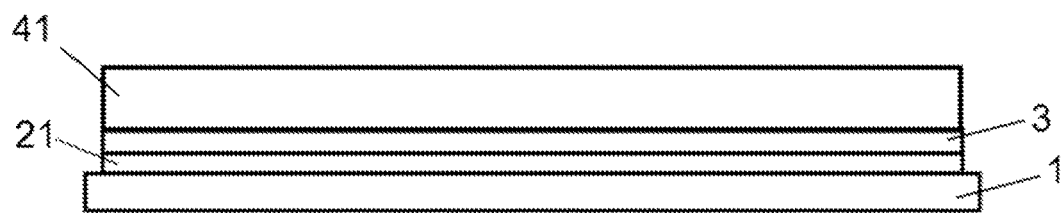
FIGS. 2a to 2d schematically shows the layer sequences, as they may be observed during the course of the method according to the invention.

As shown in FIG. 2a, the front contact (21) and the CdS layer (3) have already been applied on the transparent substrate (1) by means of methods according to the state of the art. As front contact (21), a 450 nm thick transparent bi-layer [Fluorine doped tin oxide (350 nm) as conducting layer and tin oxide (100 nm) as high resistive buffer] was applied (as TCO). The CdS layer (3) reaches a thickness of 90 nm and was deposited using CSS technique. On this, the first CdTe layer (41) according to the invention is deposited with a thickness of 1.6 μm. The deposition process was performed as a CSS process at a substrate temperature of 530° C. resulting in large grains of the deposited layer.

Figure 2B:

FIG. 2b schematically shows the applied sacrificial doping layer (5) above the first CdTe layer (41). The sacrificial doping layer (5) consists of elemental antimony (Sb) and was deposited with a thickness of 2 nm using a sputter process at a substrate temperature of 280° C.

Figure 2C:
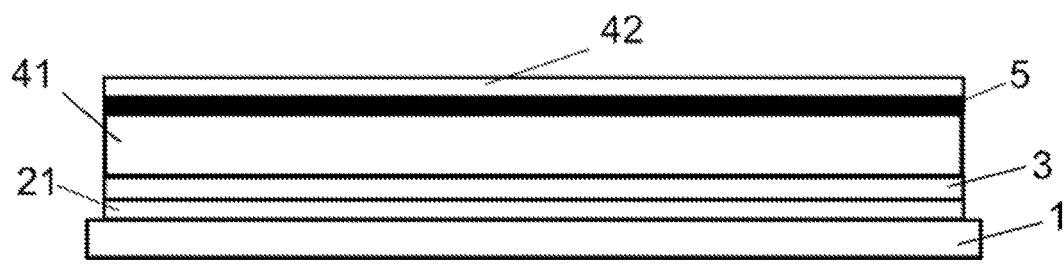

FIG. 2c schematically shows the layer stack of the solar cell after depositing the second CdTe layer (42) on the sacrificial doping layer (5). The second CdTe layer (42) was deposited with a thickness of 400 nm using a CSS process at a substrate temperature of 300° C. The second CdTe layer

(42) has small grains which cover the grain boundaries of the first CdTe layer (41). The sacrificial doping layer (5) does not cover the grain boundaries of the first CdTe layer (41) completely caused by the very small layer thickness of the sacrificial doping layer (5). However, it is uniformly distributed over the first CdTe layer surface. This ensures uniform doping of the resulting CdTe layer. Furthermore, the sacrificial doping layer (5) starts to break up during the deposition of the second CdTe layer (42), wherein the antimony moves into the first CdTe layer (41) as well as in the partly deposited second CdTe layer (42). However, since the antimony is not diffused into the first CdTe layer (41) and the second CdTe layer (42) to a large degree at this process step, the already diffused antimony atoms as well as a reduced thickness of the sacrificial doping layer (5) are not illustrated in FIG. 2c.

Subsequently, the known $CdCl_2$ activation step is performed at a temperature of 385° C. for 20 min.

Figure 2D:
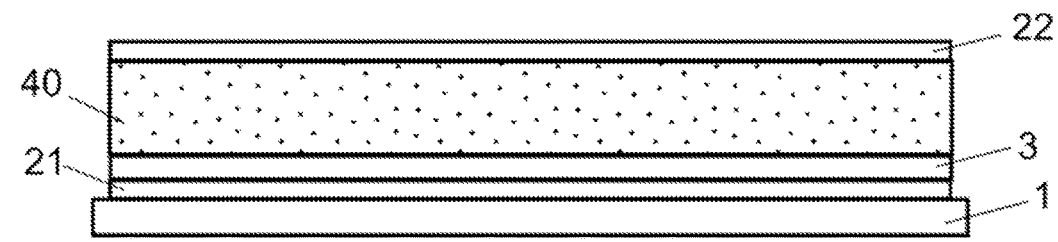

FIG. 2d schematically shows a solar cell after completing the back contact procedure. A back contact (22) comprising a metal, in this case molybdenum (Mo), has been created having a layer sequence which corresponds to that known from prior art. As shown, the sacrificial doping layer (5) is completely broken down and diffused into the CdTe layer (40) resulting from the fusion of the first CdTe layer (41) and the second CdTe layer (42), wherein the resulting CdTe layer (40) is doped with antimony (indicated by the points within the CdTe layer (40)). The diffusion of the doping element into the first and the second CdTe layers (41, 42) as well as the total breakdown of the sacrificial doping layer (5) may happen at any time during the $CdCl_2$ activation step and/or during the creation of the back contact (22) resulting in the shown layer arrangement.

The CdTe layer (40) is nearly uniformly doped, which means that no or only a small concentration gradient of the antimony in the CdTe layer (40) can be seen.

LIST OF REFERENCE NUMERALS

1 Substrate (glass)
21 Front contact (transparent, TCO)
22 Back contact (metal)
3 CdS layer
4 CdTe layer (state of the art)
40 CdTe layer
41 First CdTe layer
42 Second CdTe layer
5 Sacrificial doping layer

The invention claimed is:

1. Method for producing a solar cell, comprising the steps:
   a) applying a first CdTe layer having large grains on a base layer,
   b) applying a sacrificial doping layer comprising a doping element on the first CdTe layer, and
   c) applying a second CdTe layer having small grains on the sacrificial doping layer, wherein
      the sacrificial doping layer dissolves and breaks down during step c) and/or other process steps performed after step c).

2. Method according to claim 1, characterised in that the doping element of the sacrificial doping layer is selected from the group consisting of copper, phosphorus, antimony, bismuth, molybdenum and manganese.

3. Method according to claim 1, characterized in that the doping element is provided as an elemental layer.

4. Method according to claim 1, characterized in that the doping element is provided in a combination of different doping elements or in a composition.

5. Method according to claim 4, characterized in that the composition comprises a halogen.

6. Method according to claim 1, characterized in that the sacrificial doping layer is applied by a sputter process or by a process using a liquid solution containing the doping element.

7. Method according to claim 1, characterized in that the sacrificial doping layer is applied with a thickness in a range of 2 nm to 15 nm.

8. Method according to claim 1, characterized in that the sacrificial doping layer is applied at a substrate temperature in the range from room temperature to 350° C.

9. Method according to claim 1, characterized in that the first CdTe layer is deposited at a substrate temperature in the range from 490° C. to 540° C. with a thickness in the range from 0.5 μm to 6 μm.

10. Method according to claim 9, wherein the first CdTe layer is deposited with a thickness in the range from 1 μm to 1.8 μm.

11. Method according to claim 1, characterized in that the second CdTe layer is deposited at a substrate temperature in the range from 200° C. to 350° C. with a thickness of 20% to 40% of the total layer thickness of a CdTe layer consisting of the first CdTe layer and the second CdTe layer.

12. Method according to claim 1, characterized in that the method further comprises a temperature treatment step performed after step c) at a temperature in the range of 300° C. to 550° C.

13. Method according to claim 12, characterized in that a material containing a halogen is provided on the surface of the second CdTe layer during the temperature treatment step.

14. Method according to claim 12, wherein the temperature treatment step is performed at a temperature in the range of 300° C. to 450° C.

15. Method according to claim 1, characterized in that the method further comprises the steps of:
   d) making available a transparent substrate,
   e) applying a transparent front contact layer,
   f) applying a CdS layer, and
   g) applying a back contact layer,
   wherein the steps d), e) and f) are performed in this order before performing the steps a), b) and c) and the step g) is performed after performing the steps a), b) and c) and wherein the layer stack comprising the transparent substrate, the transparent front contact layer and the CdS layer is the base layer.

16. Method according to claim 1, characterized in that the method further comprises the steps of:
   h) making available a substrate,
   i) applying a back contact layer,
   j) applying a CdS layer, and
   k) applying a transparent front contact layer,
   wherein the steps h) and i) are performed in this order before performing the steps a), b) and c) and the steps j) and k) are performed after performing the steps a), b) and c) and wherein the layer stack comprising the substrate and the back contact is the base layer.

* * * * *